(12) United States Patent
Liu

(10) Patent No.: US 12,040,220 B2
(45) Date of Patent: Jul. 16, 2024

(54) SEMICONDUCTOR DEVICE

(71) Applicant: ChangXin Memory Technologies, Inc., Hefei (CN)

(72) Inventor: Chihcheng Liu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 393 days.

(21) Appl. No.: 17/439,690

(22) PCT Filed: Jun. 24, 2021

(86) PCT No.: PCT/CN2021/101939
§ 371 (c)(1),
(2) Date: Sep. 15, 2021

(87) PCT Pub. No.: WO2022/160577
PCT Pub. Date: Aug. 4, 2022

(65) Prior Publication Data
US 2023/0088377 A1    Mar. 23, 2023

(30) Foreign Application Priority Data
Jan. 29, 2021 (CN) .......................... 202110125689.0

(51) Int. Cl.
*H01L 21/762* (2006.01)
*H10B 12/00* (2023.01)
(52) U.S. Cl.
CPC ....... *H01L 21/76232* (2013.01); *H10B 12/30* (2023.02); *H10B 12/488* (2023.02)
(58) Field of Classification Search
None
See application file for complete search history.

(56) References Cited

U.S. PATENT DOCUMENTS

| 6,281,049 B1 * | 8/2001 | Lee | H01L 27/0207 |
| | | | 438/599 |
| 7,026,172 B2 * | 4/2006 | Lee | H01L 21/02274 |
| | | | 257/E21.279 |

(Continued)

FOREIGN PATENT DOCUMENTS

| CN | 101533848 A | * | 9/2009 | ......... G11C 13/0007 |
| CN | 107104103 A | * | 8/2017 | ............. H10B 12/03 |

(Continued)

OTHER PUBLICATIONS

Google Search, Definition of "covers" downloaded Dec. 7, 2023. Dec. 7, 2023.*

*Primary Examiner* — Michael Lebentritt
(74) *Attorney, Agent, or Firm* — Kilpatrick Townsend & Stockton LLP

(57) ABSTRACT

The present application provides a semiconductor device, which includes a shallow trench isolation structure, located in a substrate, and comprises a first region and a second region alternately arranged. The width of the first region is greater than the width of the second region. A first filling layer and a second filling layer are sequentially arranged in the first region, and a first filling layer is arranged in the second region; wherein, in the first region, the height of the first filling layer is lower than the height of the second filling layer. The device provides an advantage that the saddle-shaped shallow trench isolation structure in the first region reduces the trapping centers during any interference from adjacent word line structures, and also reduces the overlap areas of adjacent word line structures formed subsequently, thereby reducing parasitic capacitance, curtailing leakage and improving the semiconductor device's performance.

14 Claims, 8 Drawing Sheets

(56) References Cited

U.S. PATENT DOCUMENTS

| | | | | |
|---|---|---|---|---|
| 9,349,632 | B2* | 5/2016 | Zhou | H01L 21/311 |
| 11,069,559 | B1* | 7/2021 | Chen | H01L 21/76229 |
| 2008/0266927 | A1* | 10/2008 | Lee | H10B 12/485 |
| | | | | 365/51 |
| 2009/0042396 | A1* | 2/2009 | Park | H01L 21/3081 |
| | | | | 438/700 |
| 2011/0039413 | A1* | 2/2011 | Akinmade-Yusuff | |
| | | | | H01L 21/0335 |
| | | | | 438/700 |
| 2011/0115047 | A1* | 5/2011 | Hebert | H01L 29/66272 |
| | | | | 257/E29.174 |
| 2020/0350318 | A1* | 11/2020 | Kumar | H10B 12/315 |

FOREIGN PATENT DOCUMENTS

| | | | | | |
|---|---|---|---|---|---|
| CN | 105355540 | B | * | 4/2018 | ....... H01L 21/02164 |
| CN | 108717947 | A | * | 10/2018 | ......... H01L 29/1033 |
| CN | 108899309 | A | | 11/2018 | |
| CN | 108520863 | B | * | 1/2021 | ....... H01L 21/76229 |
| DE | 10204411 | A1 | * | 8/2003 | ....... H01L 21/76229 |
| KR | 102354463 | B1 | * | 1/2022 | |

* cited by examiner

US 12,040,220 B2

SEMICONDUCTOR DEVICE

CROSS REFERENCES TO RELATED APPLICATIONS

This application claims the benefit of priority to CN Patent Application CN 202110125689.0 filed on Jan. 29, 2021, both entitled "Semiconductor Device", the contents of which are incorporated herein by reference in its entirety.

TECHNICAL FIELD

This application relates to the field of semiconductor technology, in particular, to a semiconductor device.

BACKGROUND

With the highly integrated semiconductor circuits, more and more advanced manufacturing processes are applied to the semiconductor manufacturing process. With the evolution of Moore's Law to the 1x nm level (between 10 nm and 20 nm), the device active area is required to be more densely arranged. The new 3F*2F structure, (3F along the word line direction, 2F along the bit line direction, F represents the feature size) through the staggered arrangement of the active areas, makes the layout of the memory cells closer to the most dense packing pattern. However, it is precisely this layout method of staggered arrangement of the active regions that causes the word line structure (WL) to periodically pass through the area between the two active regions in a predetermined direction.

The traditional DRAM word line pattern is composed of a buried word line structure, and the access transistor is saddle-shaped to improve the performance of the semiconductor devices. As technology shrinks, narrow word line structure spacing makes word line interference (row hammer) worse, and stored charges drift to adjacent terminals. Unstable stored charges will reduce the perception margin and performance.

For example, FIG. 1 is a schematic diagram of the word line structure of the active region and the shallow trench isolation region of a conventional semiconductor device. Please refer to FIG. 1, in the predetermined direction D (that is, the extension direction of the word line structure, such as word in the extension direction of the line structure 10-1), the word line structure periodically passes through the area between the two active regions. The word line structure passing through area A is called Passing WL. As the arranged density increases, the distance between word line structures is getting smaller and smaller. When a word line structure is energized, it will not only affect the active area that it passes through, but also in the position where the word line passes through (that is, area A). It will also interact with the unpowered word lines in the active area next to it. Because of the parasitic capacitance in area A, it will also cause leakage and reduce the product yield.

Therefore, there is an urgent need for a new semiconductor device to reduce or eliminate leakage and improve the yield of semiconductor devices.

SUMMARY

The technical problem to be solved by this application is to provide a semiconductor device that can reduce parasitic capacitance, reduce leakage, and improve the performance of the semiconductor device.

In order to solve the above-mentioned problems, the present application provides a semiconductor device, which includes a shallow trench isolation structure located in a substrate, which has a first region and a second region alternately arranged, the width of the first region is greater than the width of the second area such that a first filling layer and a second filling layer are arranged in the first area in sequence, and a first filling layer is arranged in the second area; wherein, in the first area, the height of the first filling layer is smaller than the height of the second filling layer.

Further, the first filling layer in the first area and the first filling layer in the second area have the same height.

Further, the height of the first filling layer in the first area is smaller than the height of the first filling layer in the second area.

Further, the first filling layer is arranged around the second filling layer.

Further, the width of the second filling layer is less than or equal to half of the width of the first area.

Further, the first filling layer is an oxide layer, and the second filling layer is a nitride layer.

Further, the device further includes: an active region, which is disposed between the first region and the second region of the shallow trench isolation structure; and a word line structure, which is disposed on the shallow trench isolation structure along a predetermined direction above the first region, the active region, and the second region of the shallow trench isolation structure.

Further, the thickness of the word line structure disposed above the first filling layer in the first region is greater than the thickness of the word line structure disposed above the active region.

Further, the thickness of the word line structure disposed above the second filling layer in the first region is smaller than the thickness of the word line structure disposed above the active region.

Further, the thickness of the word line structure disposed above the second filling layer in the first region is greater than or equal to two-thirds of the thickness of the word line structure disposed above the active region.

Further, the thickness of the word line structure disposed above the second filling layer in the first region is equal to the thickness of the word line structure disposed above the active region.

Further, the word line structure includes a gate oxide layer, a buffer layer, and a metal layer, wherein the buffer layer covers the gate oxide layer, and the metal layer covers the buffer layer.

Further, the semiconductor device includes a plurality of word line structures, and the word line structures are arranged in parallel in a direction perpendicular to the predetermined direction.

Further, adjacent to the area where the word line structure passes, the first area or the second area is arranged in a staggered manner.

Further, the active region extends in a direction that is at an acute angle to the predetermined direction.

The advantage of the present application is that a saddle-shaped shallow trench isolation structure is formed in the first area to reduce the trap center during the interference of the word line structure, and to reduce the overlap area of the adjacent word line structure formed subsequently, thereby reducing parasitic capacitance, reducing leakage and improving the performance of semiconductor devices.

BRIEF DESCRIPTION OF THE DRAWINGS

In order to explain the technical solutions of the embodiments of the present application more clearly, the following

DETAILED DESCRIPTION OF THE PREFERRED EMBODIMENTS

In order to make the purpose, technical means and effects of this application clearer and clearer, the application will be further elaborated below in conjunction with the accompanying drawings. It should be understood that the embodiments described here are only a part of the embodiments of the present application, rather than all the embodiments, and are not intended to limit the present application. Based on the embodiments in this application, all other embodiments obtained by those skilled in the art without creative work shall fall within the protection scope of this application.

Figure 1:
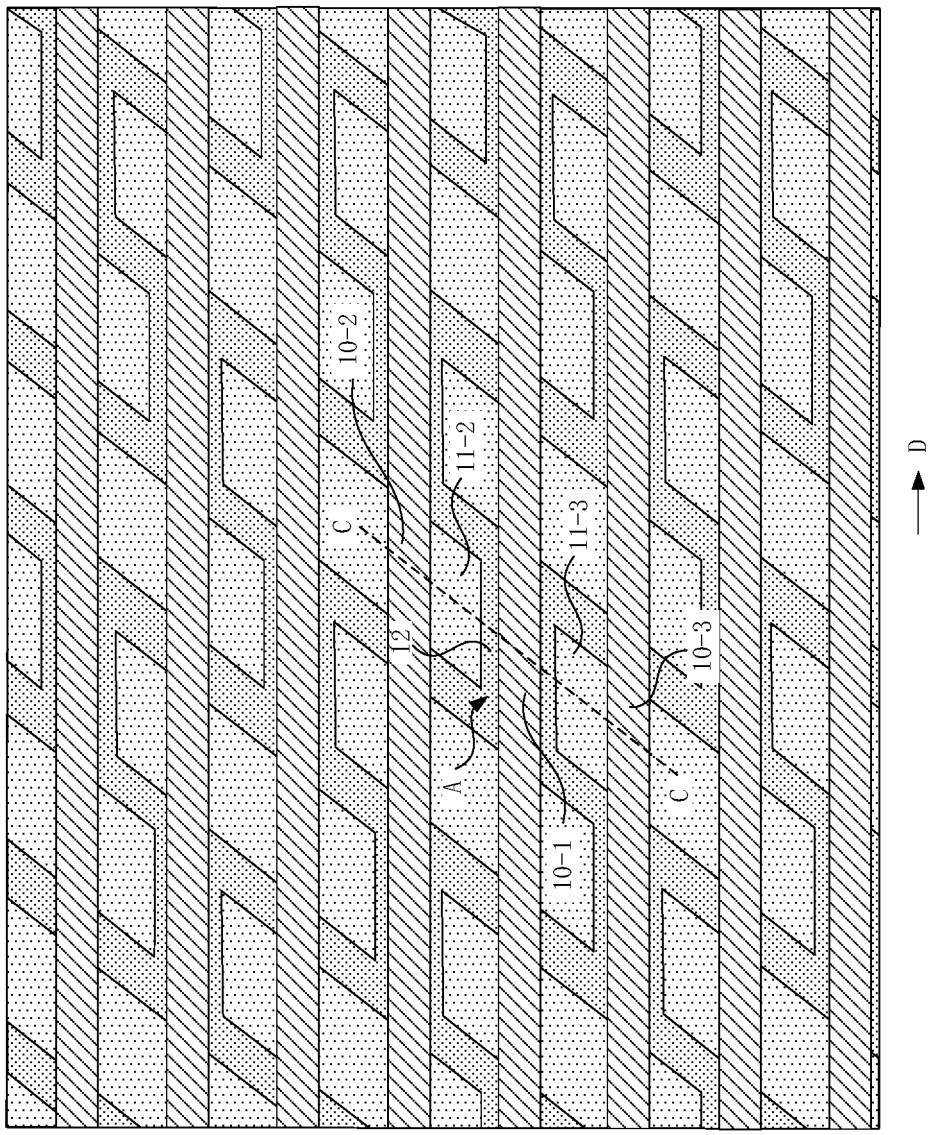
FIG. 1 is a schematic diagram of an active region and a shallow trench isolation region of a word line structure of a semiconductor device.

Please refer to FIG. 1. It has been discovered by the applicant that in a semiconductor device, a thickness of the word line structure at 44 nm (for example, word line structure 10-2) above the active region (for example, active region 11-2) is less than a thickness of the word line structure at 80 nm (for example, word line structure 10-1) above the trench isolation structure 12. Thus, the word line structure (for example, word line structure 10-1) disposed above the shallow trench isolation structure 12) has a larger thickness, then along the extension direction of the active region (for example, active region 11-2), the word line structure (for example, word line structure 10-1) arranged above the shallow trench isolation structure 12 and the arranged in overlap area of the word line structure (for example, the word line structure 10-2) above the active region (for example, the active region 11-2) is relatively large. Then, when the word line structure (for example, word line structure 10-1) is powered on, it can connect to the adjacent word line structure (for example, the word line structure 10-2) to form a larger overlap area, which generates a larger parasitic capacitance, which in turn causes leakage.

In view of the foregoing problems, the present application provides a semiconductor device that can reduce the overlap area of the word line structure located above the active region and the word line structure located above the shallow trench isolation region in the active region extension direction, thereby reducing parasitic capacitance to reduce leakage generation.

Figure 2:
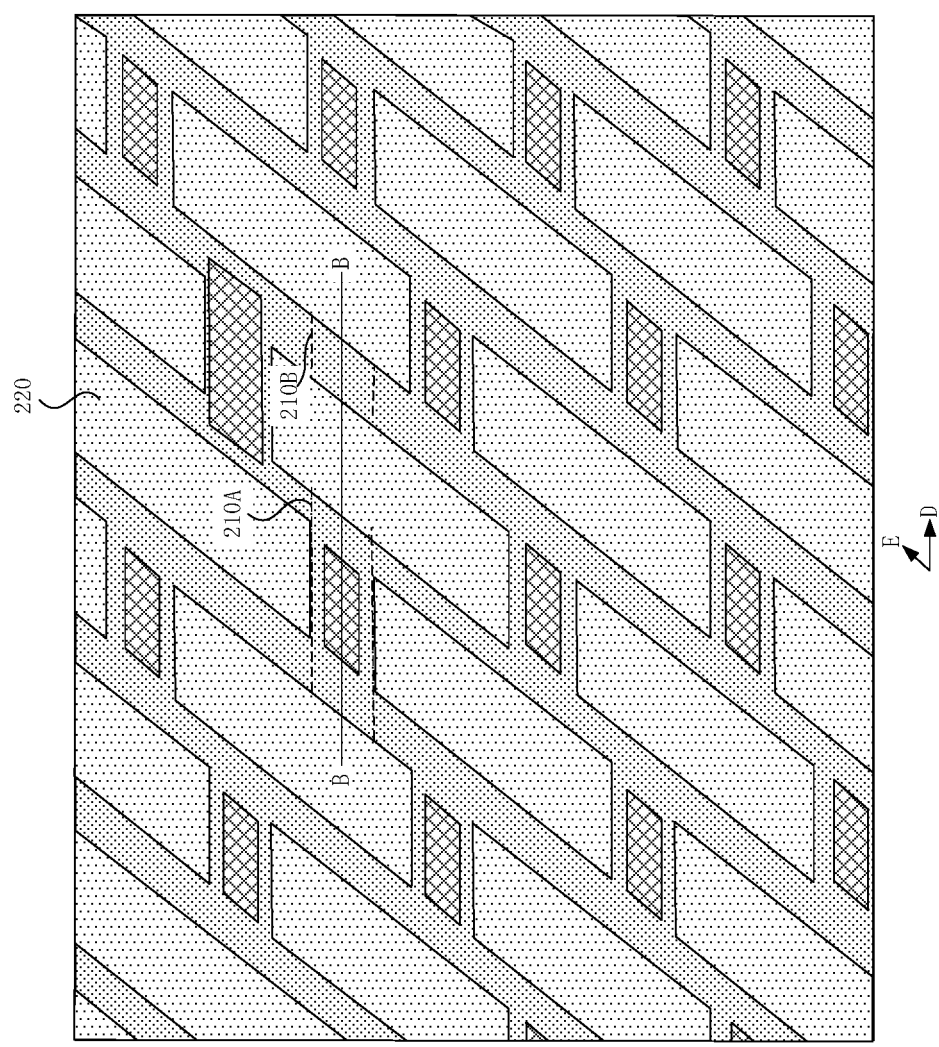
FIG. 2 is a schematic top view of the semiconductor device according to a first embodiment of the present application.
Figure 3:
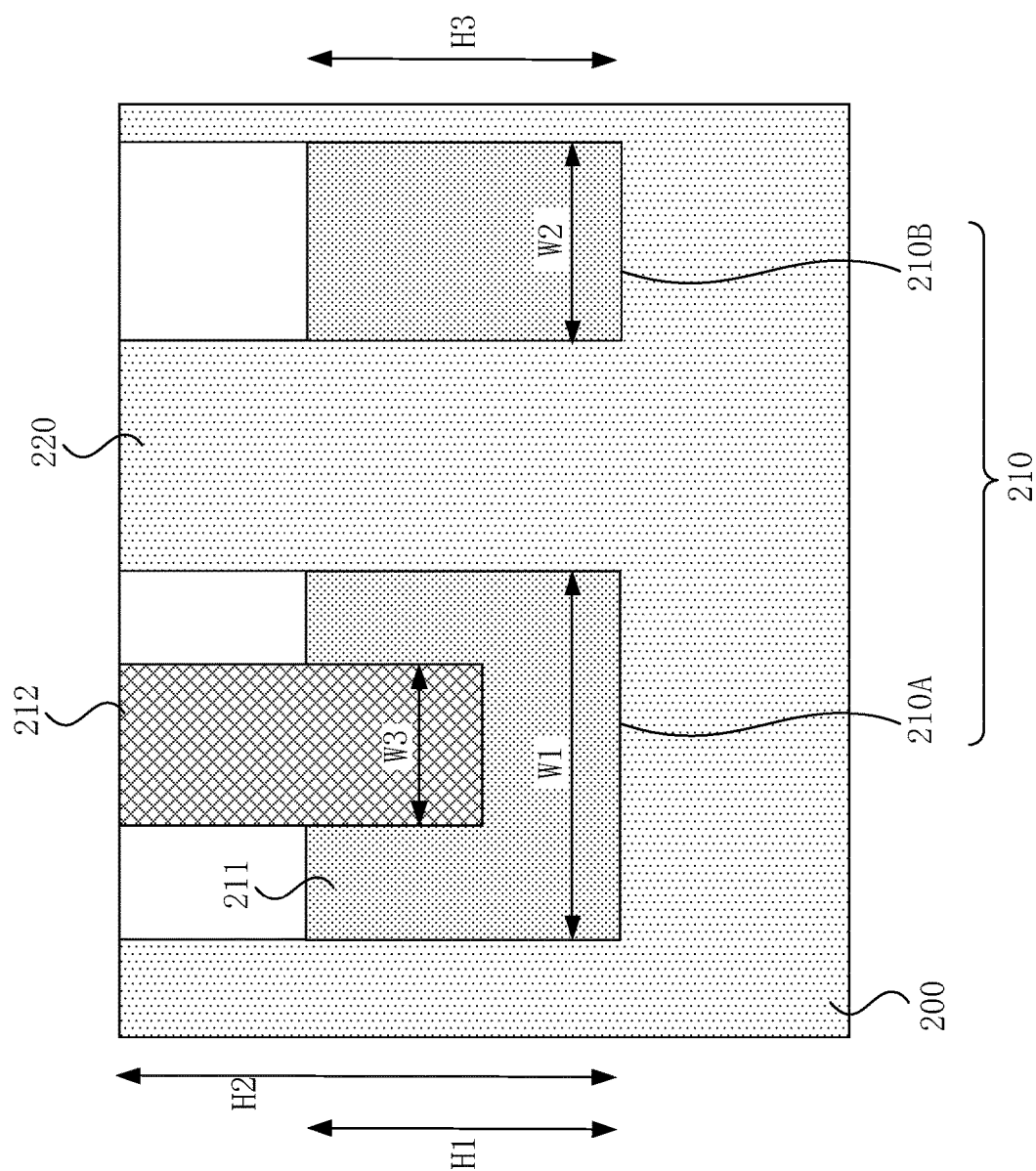
FIG. 3 is a schematic cross-sectional view taken along line B-B in FIG. 2.

FIG. 2 is a schematic top view of the semiconductor device according to a first embodiment of the present application, and FIG. 3 is a schematic cross-sectional view taken along line B-B in FIG. 2. In FIG. 2 and FIG. 3, the semiconductor device has a substrate 200 and a shallow trench isolation structure 210.

The substrate 200 may be a single crystal silicon (Si) substrate, a germanium (Ge) substrate, a SiGe substrate, silicon-on-insulator (SOI), germanium-on-insulator (GOI), or the like. According to the actual requirements of the device, a suitable semiconductor material can be selected as the substrate 200, which is not limited herein. In this embodiment, description is made by taking the substrate 200 as a single crystal silicon substrate as an example.

The shallow trench isolation structure 210 is located in the substrate 200, and the shallow trench isolation structures 210 divide the substrate 200 into a plurality of active regions 220.

In this embodiment, the method for forming the shallow trench isolation structures 210 in the substrate 200 may be: forming shallow trenches in the substrate 200 by photolithography and etch processes, and the areas defined between the shallow trenches are active regions 220. The shallow trenches are filled with material to form the shallow trench isolation structures 210. Herein, the active regions 210 extend along a predetermined direction E.

The shallow trench isolation structures 210 include the first regions 210A and the second regions 210B arranged alternately along a predetermined direction, and an active region 220 is disposed between one first region 210A and one second region 210B in the shallow trench isolation structure 210. The width W1 of the first region 210A is greater than the width W2 of the second region 210B. Herein, in FIG. 2, the first region 210A and the second region 210B are schematically outlined by dashed lines. The predetermined direction is the extension direction of the subsequently formed word line structures, and the word line structures periodically passe through the first regions 210A, the active regions 220, the second regions 210B, and the active regions 220. A word line structure passing through the first regions 210A is called a passing word line (Passing WL).

In this embodiment, the predetermined direction is the D direction as shown in FIG. 2. The predetermined direction D and the extending direction E of the active region 220 form an acute angle. Preferably, the acute angle is an angle between 60 degree and 80 degree, for example, is 69 degree according some embodiments. In other embodiments of the present application, the predetermined direction D and the active region extension direction E may also form a right angle. Herein, the included angle between the predetermined direction D and the extending direction E of the active region 202 depends on the manufacturing process of the active region 220, and will not be repeated here.

In the predetermined direction D, between two active regions 220 arranged at intervals, if the width of the shallow trench isolation structure 210 is relatively large, the isolation structure is the first region 210A; between the two adjacent active regions 220, if the width of the shallow trench isolation structure 210 is relatively small, the structure is the second region 210B.

A first filling layer 211 and a second filling layer 212 are sequentially disposed in the first regions 210A, and a first filling layer 211 is arranged in the second area 210B.

Specifically, a shallow trench is formed in the substrate 200 by using photolithography and etch processes. After the shallow trench is formed, the first region 210A is formed by a process such as chemical vapor deposition. A first filling layer 211 covers the sidewalls of the shallow trench and has the same profile as the shallow trench, and then the second filling layer 212 fills the shallow trench 210. The first filling layer 211 and the second filling layer 212 together serve as the shallow trench isolation structure 210. In the second region 210B, the first filling layer 211 is formed by a process such as chemical vapor deposition. The first filling layer 211 fills up the shallow trench and serves as the shallow trench isolation structure 210.

Since the width W1 of the first region 210A is larger than the width W2 of the second region 210B, after the first filling layer 211 is formed in the shallow trench, the shallow trench in the first region 210A is not filled up, as the shallow trenches located in the second region 210B are filled. Therefore, the second filling layer 212 continues to fill in the first region 210A, thus to fill the shallow trenches.

Further, in the first regions 210A, the first filling layer 211 is arranged around the second filling layer 212, that is, in the first regions 210A, the second filling layer 212 is arranged in the center of the first region 210A, the first filling layer 211 is disposed on the edge of the first region 210A. Furthermore, in the first region 210A, the first filling layer 211 evenly surrounds the second filling layer 212 to improve the isolation performance of the shallow trench isolation structure 210.

In the first region 210A, the height H1 of the first filling layer 211 is smaller than the height H2 of the second filling layer 212. Herein, in this embodiment, the height H1 of the first filling layer 211 refers to the distance from the bottom surface of the shallow trench isolation structure 210 to the upper surface of the first filling layer 211, and the height H2 of the second filling layer 212 refers to the distance from the bottom surface of the shallow trench isolation structure 210 to the upper surface of the second filling layer 212 of the shallow trench isolation structure 210. The distance from the bottom surface of the shallow trench isolation structure 210 to the upper surface of the first filling layer 211 is smaller than the distance from the bottom surface of the shallow trench isolation structure 210 to the top surface of the second filling layer 212. In other embodiments of the present application, a certain baseline of the substrate 200 can also be used as a reference standard to define the heights of the first filling layer 211 and the second filling layer 212. It can be understood that, in order to facilitate comparison, the height reference of the first filling layer 211 and the second filling layer 212 should be the same.

Specifically, in this embodiment, in the first region 210A, the shallow trench isolation structure is a saddle shape with a high middle and low ends. After the word line structure is subsequently formed, the shallow trench isolation structure passes through the first The thickness of the middle region (that is, the region above the second filling layer 212) of the word line structure of the region 210A (that is, through the word line) is smaller than the thickness of the two end regions (that is, the region above the first filling layer 211), so that in the direction E of the active region extension direction, the overlap area between the word line structure and its adjacent word line structure passing through the active regions is reduced, thereby reducing the word line structure and the sides of the word line structure located in the first regions 210A. The parasitic capacitances between the word line structures that pass through the active regions 220 are not turned on, thereby reducing the generation of leakage current, greatly improving the electrical performance of semiconductor devices, and improving the yield of semiconductor device products.

Furthermore, in this embodiment, in the manufacturing process of the semiconductor device of the present application, the first filling layer 211 located in the first region 210A and the second region 210B can be formed by the same process step. The first filling layer 211 in the first region 210A has the same height as the first filling layer 211 in the second region 210B, that is, the height H1 of the first filling layer 211 in the first region 210A is the same as the height H3 of the first filling layer 211 in the first region 210B. In other embodiments of the present application, since the width W1 of the first region 210A is greater than the width W2 of the second region 210B, when the filler is etched to form the first filling layer, the etching rate of the first filling layer in the region 210A is greater than that of the second region 210B, so that the height H1 of the first filling layer 211 in the first region 210A is smaller than the height H3 of the first filling layer 211 in the second region 210B.

Further, in this embodiment, the width W3 of the second filling layer 212 is less than or equal to half of the width W1 of the first region 210A, so as to maximize the electrical isolation performance of the shallow trench isolation structure and minimize the parasitic capacitance caused by the word lines, thereby reducing leakage current.

Further, the first filling layer 211 is an oxide layer, and the second filling layer 212 is a nitride layer, these can be determined according to the material of the semiconductor substrate 200. For example, in this embodiment, the semiconductor substrate 200 is a single crystal silicon substrate, the first filling layer for 210A is a silicon oxide layer, and the second filling layer is a silicon nitride layer. In other embodiments of the present application, for the semiconductor germanium substrate, the first filling layer for 210A is a germanium oxide layer, and the second filling layer 212 is a germanium nitride layer. Among them, the thermal expansion coefficient of nitride material is close to the thermal expansion coefficient of the semiconductor substrate, so nitride can reduce stress and improve the performance of the semiconductor device in the high-temperature manufacturing process of the other subsequent processes.

The semiconductor device of the present application includes a saddle-shaped shallow trench isolation structure in the first region to reduce the trapping centers during the interference of the word line structures, and to also reduce the overlapping area of the adjacent word line structures formed subsequently, thereby reducing the parasitic capacitance, leakage and improving the performance of semiconductor devices.

Figure 4:
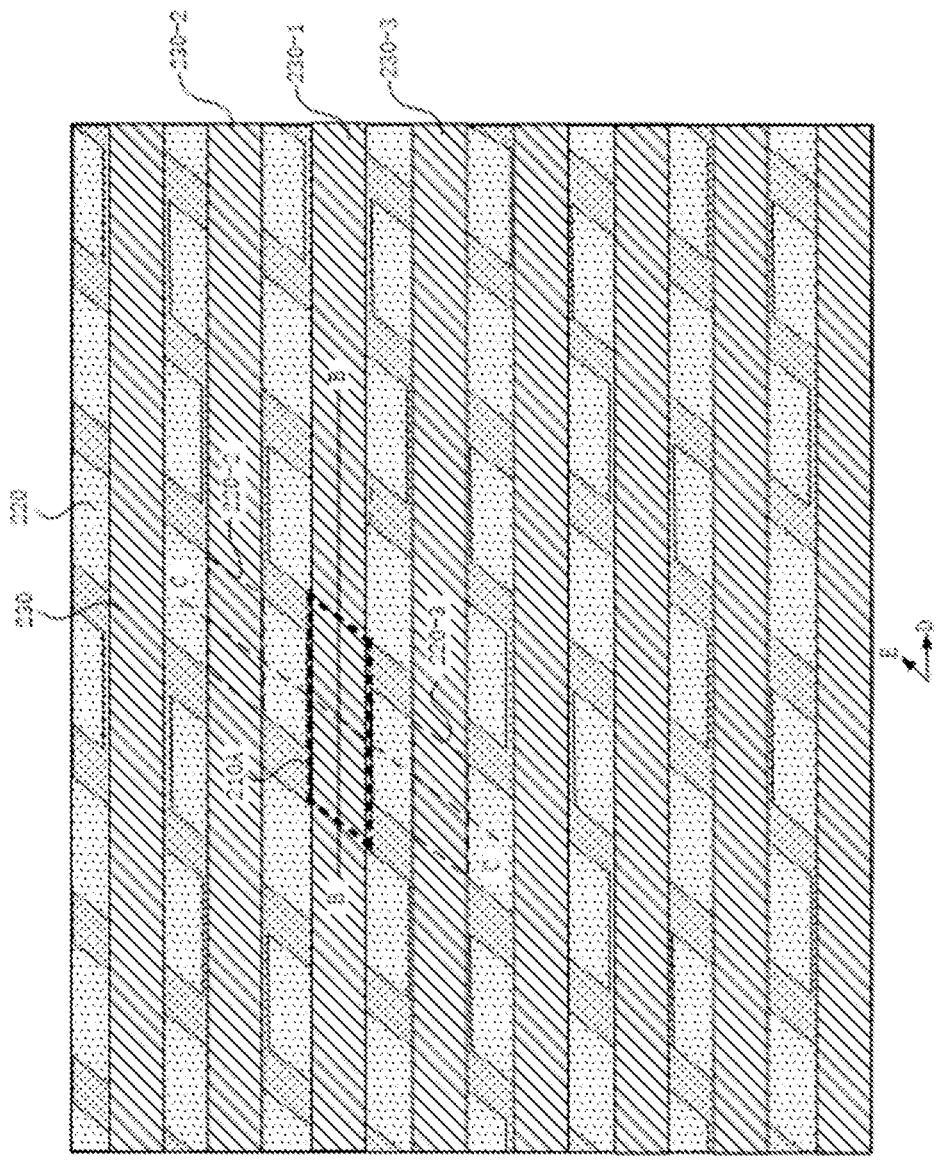
FIG. 4 is a schematic top view of a semiconductor device according to a second embodiment of the present application.
Figure 5:
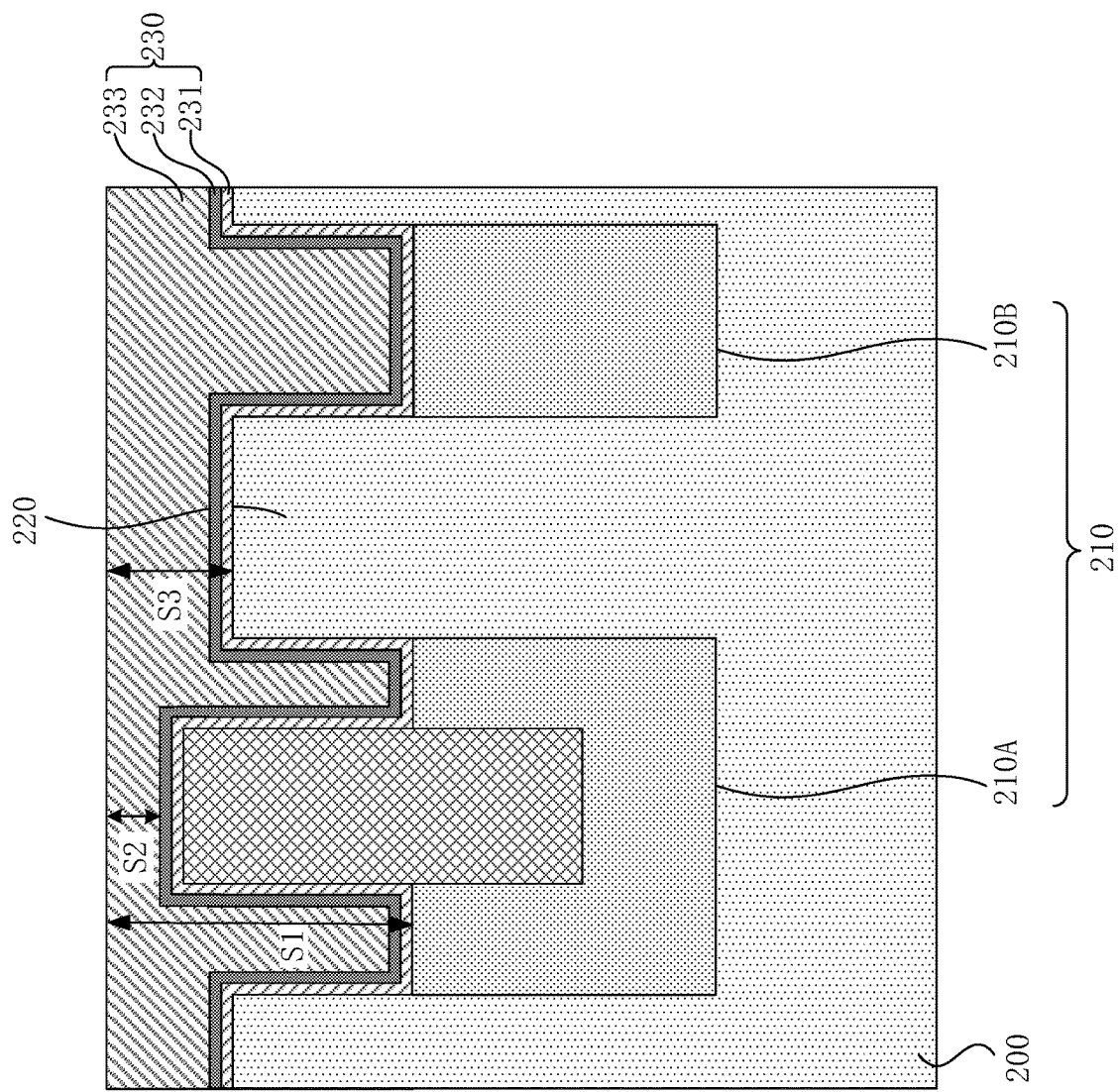
FIG. 5 is a schematic cross-sectional view taken along line B-B in FIG. 4.

This application also provides a second embodiment of a semiconductor device. FIG. 4 is a schematic top view of a semiconductor device according to a second embodiment of the present application, and FIG. 5 is a schematic cross-sectional view taken along line B-B in FIG. 4. Please refer to FIG. 4 and FIG. 5, the semiconductor device of the present application further includes a word line structure 230. The word line structure 230 is disposed in the first region 210A of the shallow trench isolation structure 210, the active region 220, and the second region 210B of the shallow trench isolation structure 210 along a predetermined direction.

Specifically, in this embodiment, the word line structure 230 extends in a predetermined direction (direction D as shown in FIG. 4), and sequentially passes through the first regions 210A of the shallow trench isolation structure 210, the active regions 220, the second regions 210B of the shallow trench isolation structure 210. The word line structure 230 fills the shallow trench isolation structure 210 and the trenches of the active region 220 to form a buried word line structure. Herein, since the height of the first filling layer 211 is smaller than the height of the second filling layer 212 in the first region 210A, after the word line structure 230 is formed, the thickness S1 of the word line structure 230 above the first filling layer 211 is greater than the thickness S2 of the word line structure 230 disposed above the second filling layer 212 of the first region 210A.

Figure 7A:
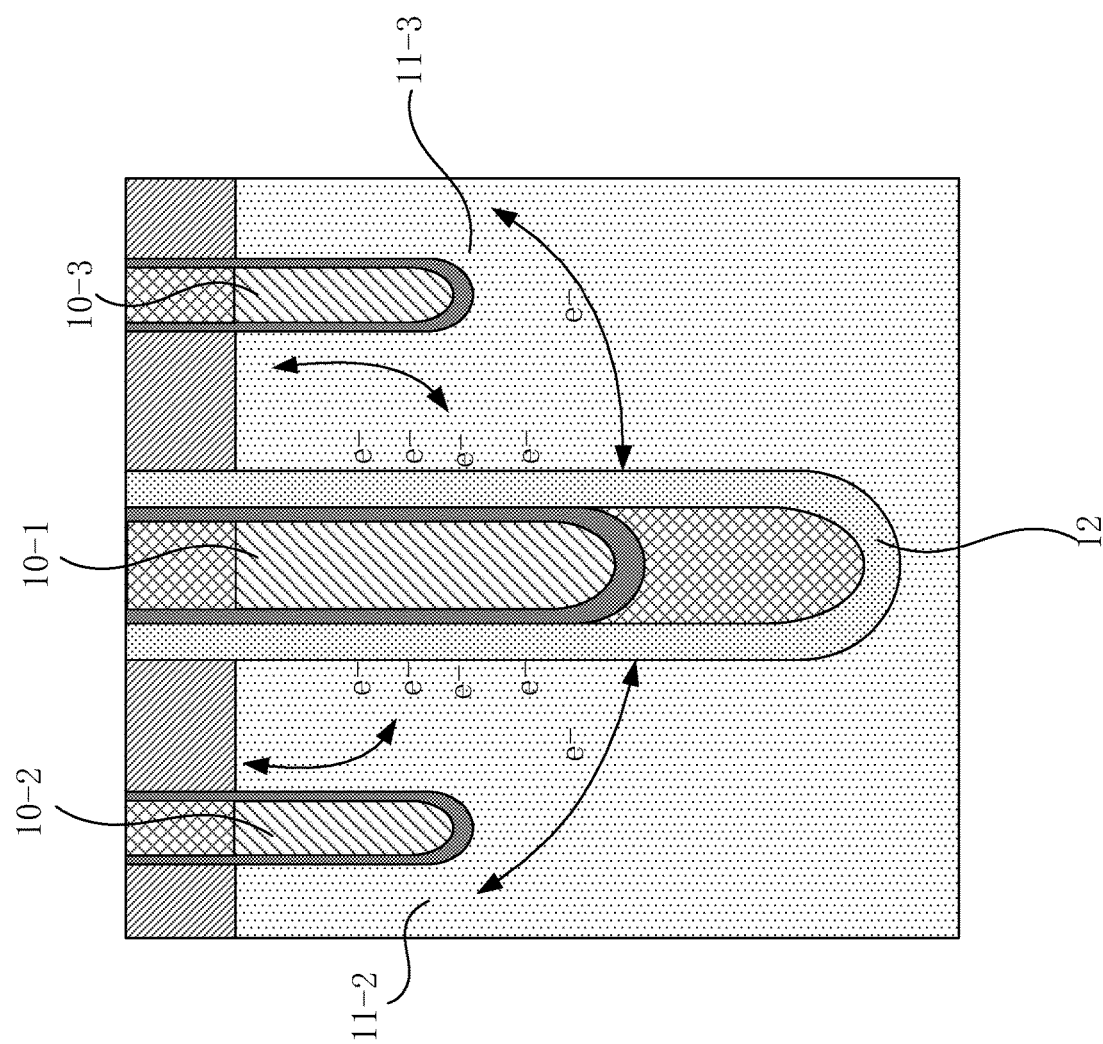
FIG. 7A is a schematic cross-sectional view taken along line C-C in FIG. 1 in an existing art.
Figure 7B:
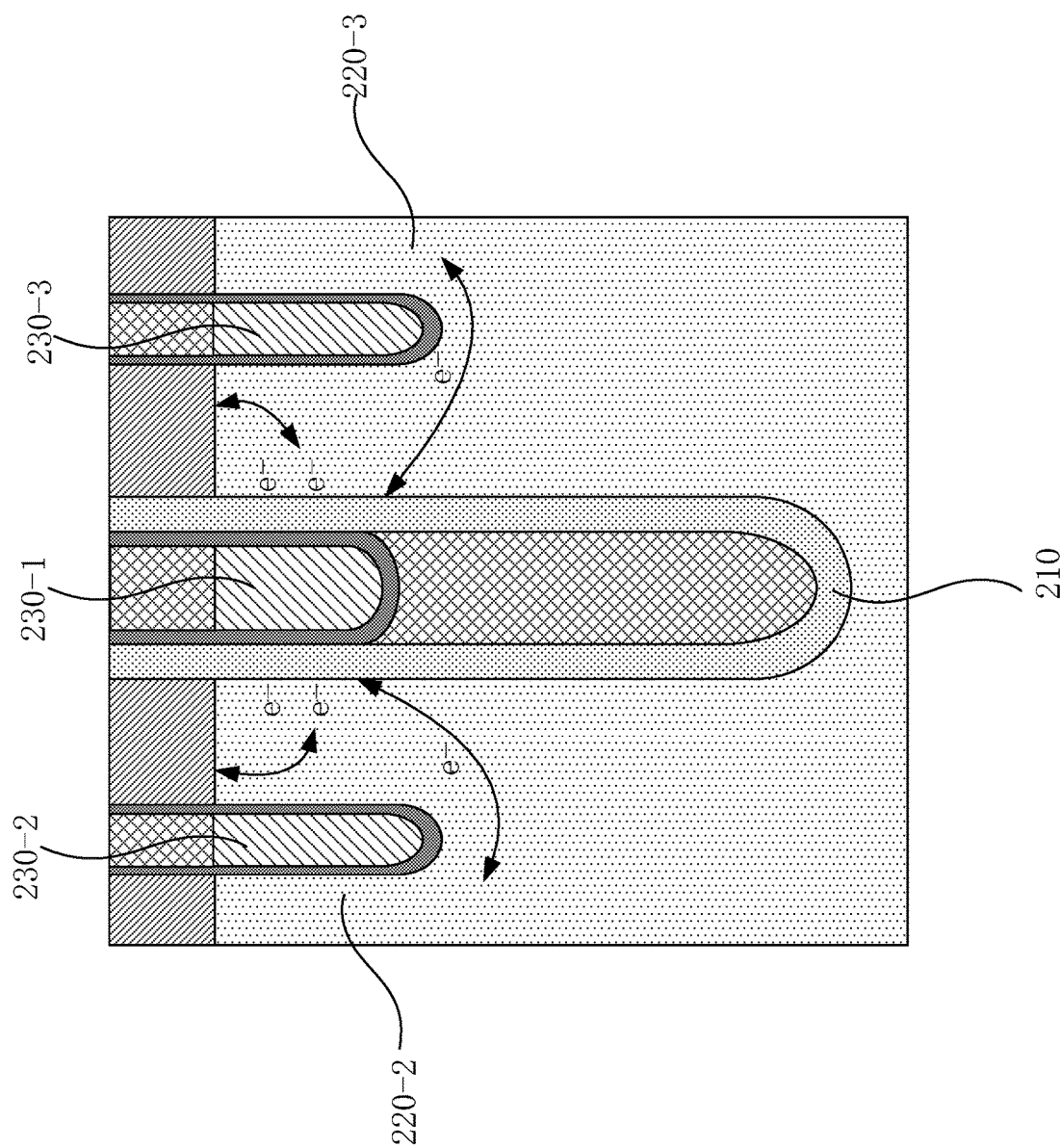
FIG. 7B is a schematic cross-sectional view along the line C-C in FIG. 4 according to the present application.

That is, referring to FIG. 5, in the first region 210A, the word line structure 230 is a concave shape with a thin middle portion and thick ends, that is, the thickness of the middle region (that is, the region above the second filling layer 212) of the word line structure passing through the first region is less than the thickness of the two end regions (that is, the region above the first filling layer 211). Referring to FIG. 7B, which is a schematic cross-sectional view along the C-C line in FIG. 4, along the extending direction E of the active region 220, the thickness of the word line structure 230 is small, so that the word line structure 230 passing through the active region in the extension direction E of the active area 220 has a smaller overlapping area with adjacent ones, thereby reducing the parasitic capacitance between the word line structure 230 located in the first region 210A and the word line structure that passes the active region 220 and yet not turned on, thereby reducing the generation of leakage current, the electrical performance of semiconductor devices is greatly improved, and the yield of semiconductor products is improved.

Further, in this embodiment, the thickness S1 of the word line structure 230 disposed above the first filling layer 211 of the first region 210A is greater than the thickness S3 of the word line structure 230 disposed above the active region 220, and the thickness S4 (not shown in FIG. 5) of the word line structure 230 disposed above the first filling layer 211 of the second region 210B is greater than the thickness S3 of the word line structure 230 disposed above the active region 220. That is, in the semiconductor device of the present application, the word line structure located above the shallow trench isolation structure 210 and the word line structure located above the active region 220 are in a saddle structure to enhance the performance of the semiconductor device. The semiconductor device of the present application can reduce parasitic capacitance and leakage current while keeping the word line structure in a saddle structure, which greatly improves the performance of the semiconductor device. Further, the thickness S2 of the word line structure 230 disposed above the second filling layer 212 of the first region 210A is smaller than the thickness S3 of the word line structure 230 disposed above the active region 220, and is disposed in the first region 210A. The thickness S2 of the word line structure 230 above the second filling layer 212 in a region 210A is greater than or equal to two-thirds of the thickness S3 of the word line structure 230 disposed above the active region 220, so as to reduce parasitic capacitance. At the same time, the resistance of the word line structure is maintained at a reasonable level.

Figure 6:
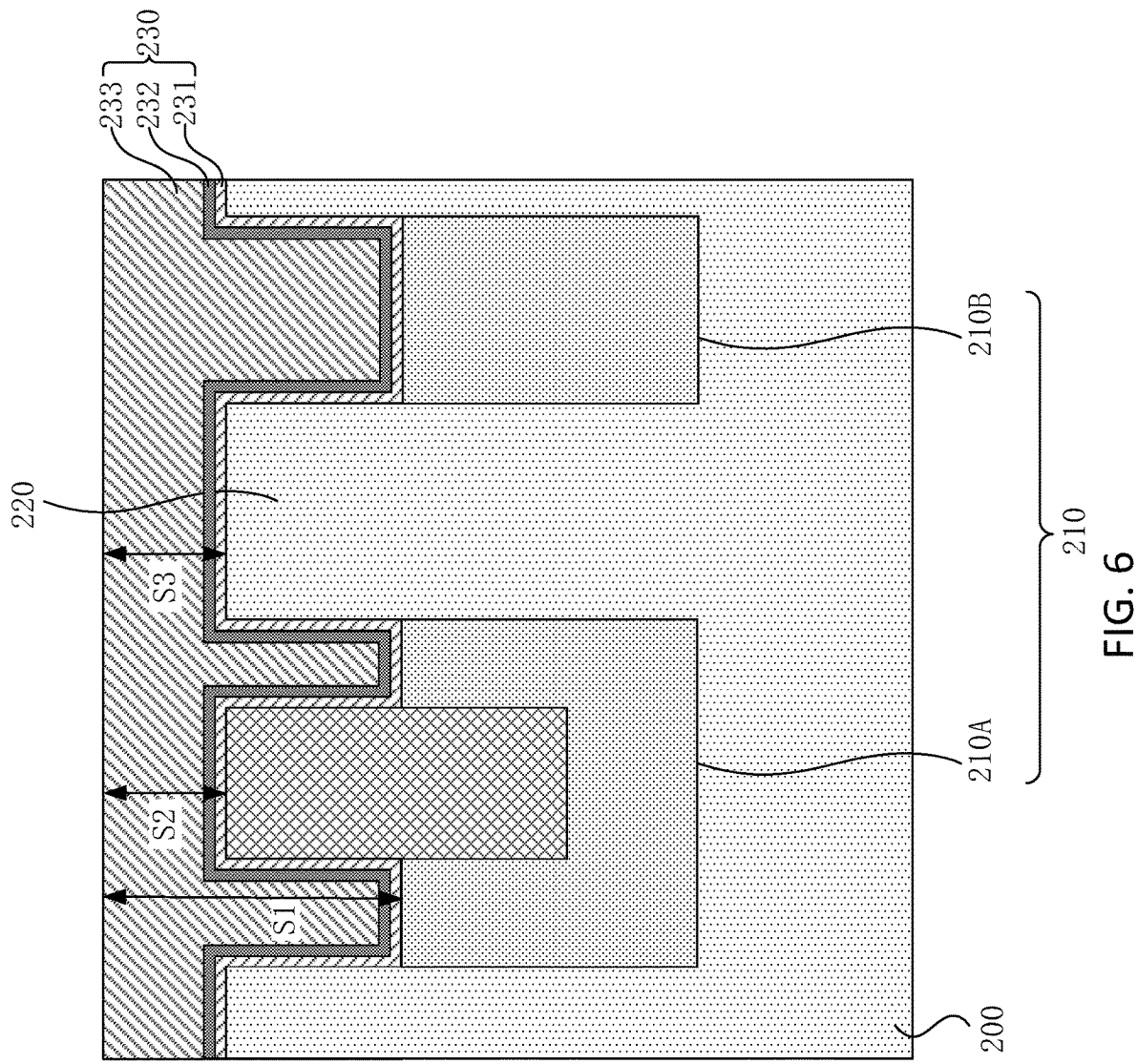
FIG. 6 is a schematic cross-sectional view of a semiconductor device according to a third embodiment of the present application.

In another embodiment of the present application, the thickness S2 of the word line structure 230 disposed above the second filling layer 212 of the first region 210A is equal to the thickness S3 of the word line structure 230 disposed above the active region 220. Specifically, please refer to FIG. 6, which is a schematic cross-sectional view of the third embodiment of the semiconductor device of this application. In the third embodiment, the word line structure 230 disposed above the second filling layer 212 of the first region 210A has the thickness S2 which is equal to the thickness S3 of the word line structure 230 disposed above the active region 220.

Further, please continue to refer to FIGS. 4 and 5, the word line structure 230 includes a gate oxide layer 231, a buffer layer 232 and a metal layer 233. The gate oxide layer 231 covers the shallow trench isolation structure 210 and the surface of the active region 220 where the word line structure 230 needs to be formed, the buffer layer 232 covers the gate oxide layer 231, and the metal layer 233 covers the buffer layer 232.

This embodiment discloses a method for preparing the word line structure 230 specifically includes the following steps: disposing the surface of the shallow trench isolation structure 210 and the active region 220 with a gate oxide layer 231, where thermal oxidation can be used, and methods such as oxidation is applied to form the gate oxide layer 231; forming the buffer layer 232 on the surface of the gate oxide layer 231, wherein the buffer layer 232 can be formed by atomic layer deposition or chemical vapor deposition; filling the metal material layer, wherein the method of filling the metal material layer can be a chemical vapor deposition process; removing the excess metal material layer, and only leaving the metal material above the shallow trench isolation structure 210 and the active region 220 layer to form a metal layer 233, in which a mechanical grinding and etching process can be used to remove the excess metal material layer.

In this embodiment, the gate oxide layer 231 is silicon oxide, the buffer layer 232 is a Ti/TiN layer, and the metal layer 233 is a metal tungsten layer. In other embodiments of the present application, the word line structure 230 may also be other structures.

The semiconductor device includes a plurality of word line structures 230, arranged in parallel in a direction perpendicular to the predetermined direction (direction D as shown in FIG. 4). When a word line structure is energized and turned on, it will form a parasitic capacitance with other non-energized word line structures 230 in the active region 220 adjacent to it, thereby causing leakage. In the present application, a first filling layer 211 and a second filling layer 211 with different heights are arranged in the first region 210A, so that the thickness of the word line structure 230 formed in the first region 210A is reduced, so as to reduce trapping centers during the interference of the word line structure, and reduce the overlapping area of adjacent word line structures, thereby reducing parasitic capacitance, reducing leakage, and improving the performance of semiconductor devices.

For example, please continue to refer to FIG. 4, taking the word line structure 230-1, the word line structure 230-2, and the word line structure 230-3 as examples. The word line structure 230-1 extends along the D direction and periodically passes through the second regions 210B, the active regions 220, the first regions 210A, and the active region 220; the word line structure 230-2 extends along the D direction and passes through the second region 210B periodically, the active region 220, the first region 210A, and the active region 220, the word line structure 230-3 extends along the D direction, and periodically passes through the second regions 210B, the active regions 220, the first regions 210A, and the active regions 220. The thickness of the word line structure 230-1 located above the second filling layer 212 of the first region 210A is smaller than that of the word line structure 230-2 located above the active region 220-2 and the thickness of the word line structure 230-2 located above the active regions 220-2. The thickness of the word line structure 230-3 above the source regions 220-3 reduces the trapping centers during the interference of the word line structure, and makes it located in the direction along the extension direction (E direction) of the active regions 220. The overlapping area of the word line structure 230-1 above the second filling layer 212 of the first region 210A and the word line structure 230-2 and the word line structure 230-3 above the active region 220 is reduced to be small. When the word line structure 230-1 is activated but the word line structure 230-2 and the word line structure 230-3 are not activated, the electron transmission is reduced, thereby reducing the parasitic capacitance, reducing the leakage, and improving the performance of the semiconductor device.

Further, adjacent to the area through which the word line structure 230 passes, the first region 210A and the second region 210B are staggered. Specifically, please continue to refer to FIG. 4, taking the word line structure 230-1 and the word line structure 230-2 as an example, the first region 210A located in the area passed by the word line structure 230-1 and the first region 210A of the area passed by the word line structure 230-2 are not arranged in the direction perpendicular to the predetermined direction (D direction), nor are they arranged in the extension direction of the active area 220 (E direction) are arranged directly opposite to each other, but arranged in a staggered way. The second region 210B located in the area passed by the word line structure 230-1 and the second region 210B located in the area passed by the word line structure 230-2 are also set staggered. Wherein, the first region 210A located in the area passed by the word line structure 230-1 and the second area 210B located in the area passed by the word line structure 230-2 are located partially overlapping along the extension direction of the active area 220 (E Direction).

Further, in the present embodiment, in the extending direction (E direction) of the active regions 220, the first region 210A located in the area passed by the word line structure 230-1 is different from the first region 210A located in the area where the word line structure 230-2 passes. The first region 210A of the area passed by 230-2 is staggered and partially overlapped, and the second region 210B located in the area passed by the word line structure 230-1 and the second region 210B located in the area passed by the word line structure 230-2 are completely staggered and has no overlap.

Furthermore, in this embodiment, the area above the word line structure 230 and the area of the substrate 200 not covered by the word line structure 230 area are also covered with a passivation layer. The passivation layer protects the word line structure 230 and the substrate 200 from damages of the external environment or subsequent processes on the semiconductor devices. In this embodiment, the passivation layer is a silicon nitride layer. In other embodiments of the present application, the passivation layer may also be other structural layers.

The thickness of the word line structure located above the second filling layer 212 of the first region 210A of the shallow trench isolation structure 210 is reduced, thereby reducing the trapping centers of the subsequent interference devices to the word lines, which then reduces the parasitic capacitance, leakage current and improve the performance of semiconductor devices.

The principle of reducing parasitic capacitance of the semiconductor device of the present application will be further explained below in conjunction with FIG. 7A and FIG. 7B. FIG. 7A is a schematic cross-sectional view taken along line C-C in FIG. 1 in the existing art, in which word line structures are provided above the active regions and above the shallow trench isolation structure; FIG. 7B is a schematic cross-sectional view taken along line C-C in FIG. 4 of the present application, herein, a word line structure is provided above the active region and above the second filling layer of the first region of the shallow trench isolation structure.

Referring to FIG. 1 and FIG. 7A, the active region 11-2 and the active region 11-3 of the semiconductor device are respectively provided with a word line structure 10-2 and a word line structure 10-3, and the shallow trench isolation structure 12 is provided with word line structure 10-1. Herein, the thickness of the word line structure 10-2 and the word line structure 10-3 arranged above the active regions is smaller than the thickness of the word line structure 10-1 arranged above the shallow trench isolation structure 12, that is, the thickness of the word line structure 10-1 arranged above the shallow trench isolation structure 12. The word line structure 10-1 above the isolation structure 12 has a relatively large thickness, which means, the word line structure 10-1 disposed above the shallow trench isolation structure 12 along the extension direction of the active region 11-2 and the active region 11-3 have relatively large overlapping areas with the word line structure 10-2 and the word line structure 10-3 disposed above the active area. When the word line structure 10-1 is energized and turned on, it will induce the adjacent word line structure 10-2 and the word line structure 10-3 which are located above the active area 11-2 and the active area 11-3 that are not turned on. The overlapping areas are larger, so electrons are transported more, resulting in larger parasitic capacitance, which in turn causes leakage.

In FIG. 4 and FIG. 7B, the active region 220-2 and the active region 220-3 of the semiconductor device are respectively provided with a word line structure 230-2 and a word line structure 230-3, the first shallow trench isolation structure of word line structure 230-1 is provided on the second filling layer 212 of the first region 210A. Herein, the thickness of the word line structure 230-1 disposed on the second filling layer 212 of the first region 210A of the shallow trench isolation structure 210 is less than or equal to the thickness of the word line structure 230-1 disposed above the active region 220-2 and the active region 220-3. The thickness of the word line structure 230-1 disposed above the second filling layer 212 of the first region 210A of the shallow trench isolation structure 210, compared with the existing art (the structure shown in FIG. 7A), is reduced. So that the second filling layer 212 of the first region 210A of the shallow trench isolation structure 210, arranged along the extension direction of the active area 220-2 and the active area 220-3, has less overlap area with the word line structure 230-1 above the layer 212, and the word line structure 230-2 and the word line structure 230-3 disposed over the active area 220-2 and the active area 220-3 is reduced. When the word line structure 230-1 is energized and turned on, it induces less electron transmission from the not-turned-on yet adjacent word line structure 230-2 and the word line structure 230-3, located above the active area 220-2 and the active area 220-3, and the word line structure 230-3, because of the smaller overlapping area, thereby reducing the parasitic capacitance, the leakage, and improving the performance of the semiconductor device.

The above are only the preferred embodiments of this application. It should be pointed out that for those of ordinary skill in the art, without departing from the principle of this application, several improvements and modifications can be made, and these improvements and modifications should also be considered in the scope of protection of this application.

The invention claimed is:

1. A semiconductor device, comprising:
   a shallow trench isolation structure, located in a substrate, wherein the shallow trench isolation structure comprises a first region and a second region alternately arranged; and
   an active region, disposed between the first region and the second region in the shallow trench isolation structure;
   a word line structure, extending in a predetermined direction, and near and above the first region of the shallow trench isolation structure, the active regions, and the second region of the shallow trench isolation structure;
   wherein a width of the first region is greater than a width of the second region;
   wherein the first region comprises a first filling layer and a second filling layer disposed in a center of the first region, wherein the first filling layer is arranged around the second filling layer, wherein the second region comprises the first filling layer, but not the second filling layer; and
   wherein a height of the first filling layer is lower than a height of the second filling layer in the first region.

2. The semiconductor device according to claim 1, wherein the first filling layer in the first region and the first filling layer in the second region have a same height.

3. The semiconductor device according to claim 1, wherein the height of the first filling layer in the first region is smaller than the height of the first filling layer in the second region.

4. The semiconductor device according to claim 1, wherein the first filling layer is disposed around the second filling layer.

5. The semiconductor device according to claim 1, wherein a width of the second filling layer is less than or equal to a half of a width of the first region.

6. The semiconductor device according to claim 1, wherein the first filling layer is an oxide layer, and the second filling layer is a nitride layer.

7. The semiconductor device according to claim 1, wherein a thickness of the word line structure disposed above the first filling layer in the first region is greater than a thickness of the word line structure disposed above the active region.

8. The semiconductor device according to claim 1, wherein a thickness of the word line structure disposed above the second filling layer in the first region is smaller than the thickness of the word line structure disposed above the active region.

9. The semiconductor device according to claim 8, wherein the thickness of the word line structure disposed above the second filling layer in the first region is greater than or equal to two-thirds of the thickness of the word line structure disposed above the active region.

10. The semiconductor device according to claim 1, wherein a thickness of the word line structure disposed above the second filling layer in the first region is equal to the thickness of the word line structure disposed above the active region.

11. The semiconductor device according to claim 1, wherein the word line structure comprises a gate oxide layer, a buffer layer, and a metal layer, wherein the buffer layer covers the gate oxide layer, and wherein the metal layer covers the buffer layer.

12. The semiconductor device according to claim 1, wherein the semiconductor device further comprises more than one of the word line structures, wherein the more than one of the word line structures are arranged in parallel in a direction perpendicular to the predetermined direction.

13. The semiconductor device according to claim 12,
   wherein the first region located in the area near the word line structure and the first region located in the area at an adjacent word line structure are arranged in a staggered way in a direction perpendicular to extending direction of the active area, and
   wherein the second region located in the area near the word line structure and the second region located in the area at the adjacent word line structure are arranged in a staggered way in a direction perpendicular to the extending direction of the active area.

14. The semiconductor device according to claim 1, wherein the active region extends in a direction at an acute angle to the predetermined direction.

* * * * *